(12) United States Patent
Yeh et al.

(10) Patent No.: US 8,053,836 B2
(45) Date of Patent: Nov. 8, 2011

(54) OXIDE SEMICONDUCTOR THIN-FILM TRANSISTOR

(75) Inventors: Yung-Hui Yeh, Hsinchu (TW);
Chun-Cheng Cheng, Pingtung (TW);
Jian-Jang Huang, Taipei (TW);
Shih-Hua Hsiao, Taipei (TW);
Kuang-Chung Liu, Yonghe (TW)

(73) Assignees: Industrial Technology Research Institute, Hsin-Chu (TW); National Taiwan University, Taipei (TW)

( * ) Notice: Subject to any disclaimer, the term of this patent is extended or adjusted under 35 U.S.C. 154(b) by 274 days.

(21) Appl. No.: 12/475,711

(22) Filed: Jun. 1, 2009

(65) Prior Publication Data
US 2010/0276682 A1   Nov. 4, 2010

(30) Foreign Application Priority Data

Apr. 29, 2009   (TW) .............................. 98114172 A

(51) Int. Cl.
*H04L 29/02*   (2006.01)
(52) U.S. Cl. .......... 257/345; 257/66; 257/327; 257/368; 257/E29.277

(58) Field of Classification Search .................... 257/59, 257/66, 72, 219–221, 235, 269, 285, 288, 257/327, 368, 345, E21.372, E29.277
See application file for complete search history.

(56) References Cited

U.S. PATENT DOCUMENTS
2009/0294772 A1 * 12/2009 Jeong et al. ..................... 257/59
* cited by examiner

*Primary Examiner* — Evan Pert
*Assistant Examiner* — Scott R Wilson
(74) *Attorney, Agent, or Firm* — Morris Manning Martin LLP; Tim Tingkang Xia, Esq.

(57) ABSTRACT

An oxide semiconductor thin-film transistor, comprising: a source electrode and a drain electrode formed on a substrate; a composite semiconductor active layer formed between the source electrode and the drain electrode; a gate dielectric layer formed on the source electrode, the composite semiconductor active layer and the drain electrode; and a gate electrode formed on the gate dielectric layer and corresponding to the composite semiconductor active layer; wherein the composite semiconductor active layer comprises a low carrier-concentration first oxide semiconductor layer and a high carrier-concentration second oxide semiconductor layer.

28 Claims, 7 Drawing Sheets

OXIDE SEMICONDUCTOR THIN-FILM TRANSISTOR

FIELD OF THE INVENTION

The present invention generally relates to an oxide semiconductor thin-film transistor (TFT).

BACKGROUND OF THE INVENTION

Flexible electronic products are required to be light, portable and flexible so that they can be warped and bended without mal-functionality. Owing to the ionic bond structure in the oxide semiconductor TFT, the on-current characteristics of the TFT are less sensitive to the warping of the substrate. Moreover, since the oxide semiconductor TFT exhibits higher carrier mobility (about 10 $cm^2$/V-sec) than the amorphous (a-Si:H) TFT and can be manufactured under a low temperature, it is very suitable for use in flexible electronic applications.

To enhance the current density of the TFT, U.S. Patent Appl. No. 20050199879 discloses a TFT using a dual-gate structure on the top and bottom surfaces of the active layer so as to enhance the current density by building up more carrier transport paths, as shown in FIG. 1A and FIG. 1B. In FIG. 1A, the TFT 100 comprises a substrate 102, two gate electrodes 103, 104, two gate dielectric layer 105, 106, an active layer 107, a source electrode 108 and a drain electrode 109. During the operation of the TFT 100, a channel is induced on each of the surfaces of the active layer by applying a bias voltage across the gate electrode 103/104 and the active layer 107 to enhance the current density. In FIG. 1B, the TFT 101 is similar to the TFT 100 in FIG. 1A except that the order for forming the drain/source 108/109 and the active layer 107 is different. The TFT 100 and the TFT 101 in FIG. 1A and FIG. 1B are problematic because they are manufactured by lots of steps, which cause complicated processing as well as increased cost.

Therefore, the present invention provides an oxide semiconductor TFT comprising a composite semiconductor active layer to enhance the current characteristics of the oxide TFT, enhance stable driving current and reduce unstable current due to oxygen vacancies. Moreover, by adjusting the thickness of the semiconductor active layer, the leakage current is kept low.

SUMMARY OF THE INVENTION

In one embodiment, the present invention provides an oxide semiconductor TFT, comprising: a source electrode and a drain electrode formed on a substrate; a composite semiconductor active layer formed between the source electrode and the drain electrode; a gate dielectric layer formed on the source electrode, the composite semiconductor active layer and the drain electrode; and a gate electrode formed on the gate dielectric layer and corresponding to the composite semiconductor active layer; wherein the composite semiconductor active layer comprises at least a low carrier-concentration first oxide semiconductor layer and a high carrier-concentration second oxide semiconductor layer.

In another embodiment, the present invention provides an oxide semiconductor TFT, comprising: a gate electrode formed on a substrate; a gate dielectric layer covering the gate electrode; a source electrode and a drain electrode formed on the gate dielectric layer; and a composite semiconductor active layer formed between the source electrode and the drain electrode and corresponding to the gate electrode; wherein the composite semiconductor active layer comprises at least a low carrier-concentration first oxide semiconductor layer and a high carrier-concentration second oxide semiconductor layer.

BRIEF DESCRIPTION OF THE DRAWINGS

The exemplary embodiments will be readily understood by the accompanying drawings and detailed descriptions, wherein.

DETAILED DESCRIPTION OF THE PREFERRED EMBODIMENT

The present invention can be exemplified but not limited by various embodiments as described hereinafter.

In the present invention, a composite semiconductor active layer is provided during thin film deposition to improve the current characteristics of the oxide semiconductor TFT, enhance the stable driving current and lower the unstable current due to oxygen vacancies. Moreover, by adjusting the thickness of the semiconductor active layer, the leakage current is kept low.

Figure 1A:
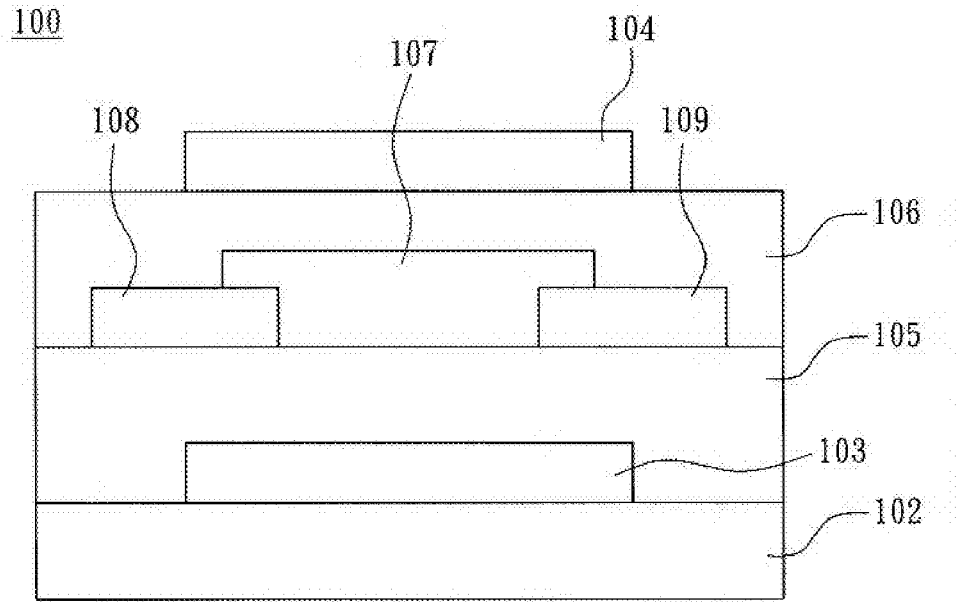
FIG. 1A and FIG. 1B are cross-sectional diagram of a TFT with a dual-gate structure in U.S. Patent Appl. No. 2005019987.
Figure 1B:
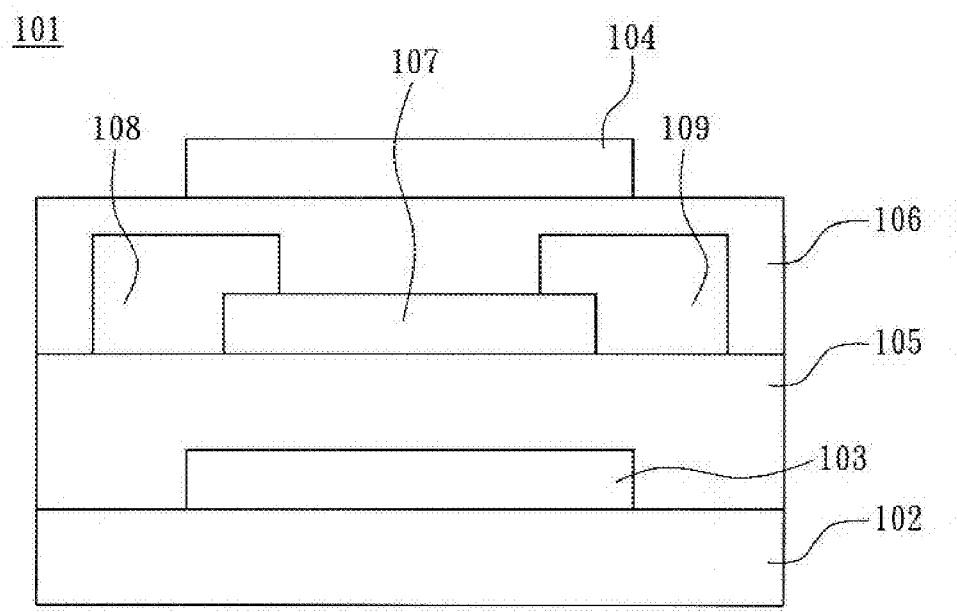
Figure 2:
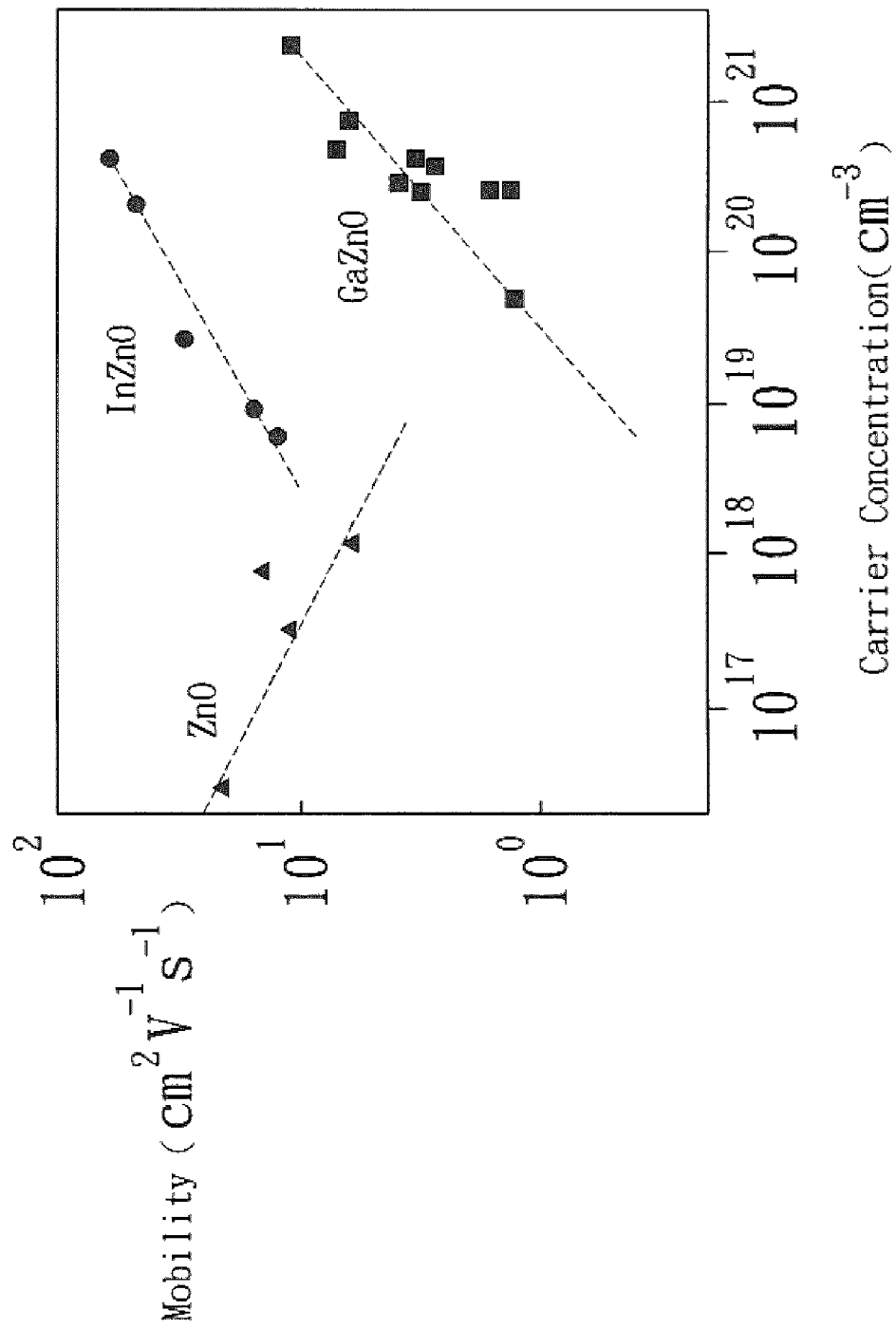
FIG. 2 shows the mobility as a function of carrier concentration with respect to various oxide semiconductor materials.

FIG. 2 shows the mobility as a function of carrier concentration with respect to various oxide semiconductor materials. In FIG. 2, the carrier mobility of ZnO decreases as the carrier concentration increases. The heavy metal ionic bond structures in InGaZnO, InZnO and GaZnO provide the carriers with excellent transport paths to exhibit high current density.

Figure 3:
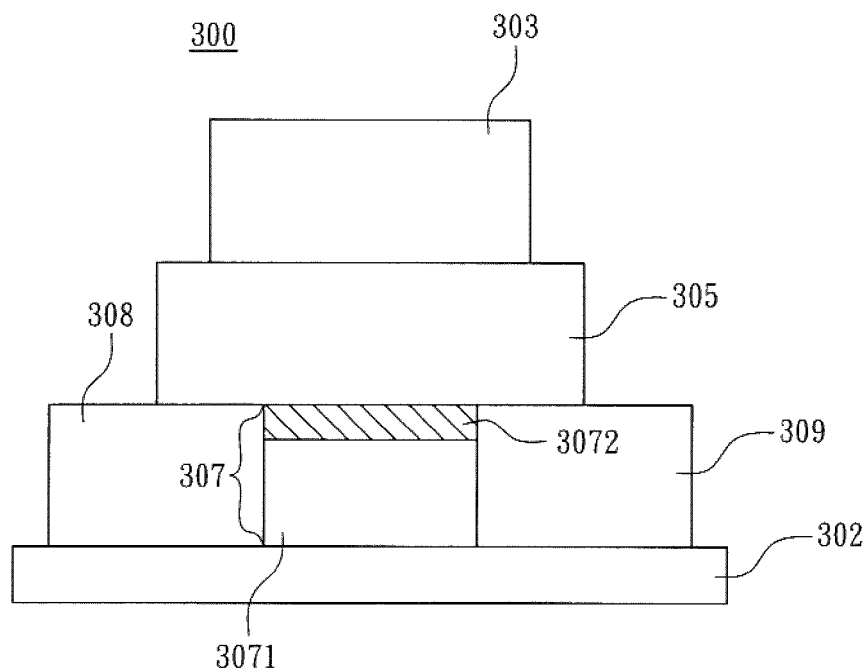
FIG. 3 is a cross-sectional diagram of an oxide semiconductor TFT according to a first embodiment of the present invention.

FIG. 3 is a cross-sectional diagram of an oxide semiconductor TFT according to a first embodiment of the present invention. In FIG. 3, an oxide semiconductor TFT 300 with a top gate structure comprises: a source electrode 308 and a drain electrode 309 formed on a substrate 302; a composite semiconductor active layer 307 formed between the source electrode 308 and the drain electrode 309; a gate dielectric layer 305 formed on the source electrode 308, the composite semiconductor active layer 307 and the drain electrode 309;

and a gate electrode 303 formed on the gate dielectric layer 305 and corresponding to the composite semiconductor active layer 307.

In the present embodiment, the composite semiconductor active layer 307 may be formed by chemical vapor-phase deposition (CVD), spin coating, printing or sputtering to comprise at least a first oxide semiconductor layer 3071 and a second oxide semiconductor layer 3072. In the present embodiment, the second oxide semiconductor layer 3072 contacts the gate dielectric layer 305. The first oxide semiconductor layer 3071 is a low carrier-concentration semiconductor layer and may comprise ZnO, while the second oxide semiconductor layer 3072 is a high carrier-concentration semiconductor layer and may comprise InSnO (ITO), InZnO, GaZnO, AlZnO, InGaZnO or combination thereof.

Alternatively, the first oxide semiconductor layer 3071 is a low carrier-concentration semiconductor layer and may comprise InGaZnO, while the second oxide semiconductor layer 3072 is a high carrier-concentration semiconductor layer and may comprise InSnO (ITO), InZnO, GaZnO or combination thereof.

In the present embodiment, the carrier concentration of the first oxide semiconductor layer 3071 is lower than $10^{17}$ cm$^{-3}$. In the present embodiment, the carrier concentration of the second oxide semiconductor layer 3072 is higher than $10^{18}$ cm$^{-3}$.

In the present embodiment, the high carrier-concentration second oxide semiconductor layer 3072 is thinner (for example, than 10 nm) so as to lower the unstable current flowing through oxygen vacancies and enhance the stable current flowing through the heavy metal ionic bond structure. Moreover, by adjusting the thickness of the low carrier-concentration first oxide semiconductor layer 3071, the leakage current is kept low.

Figure 4:
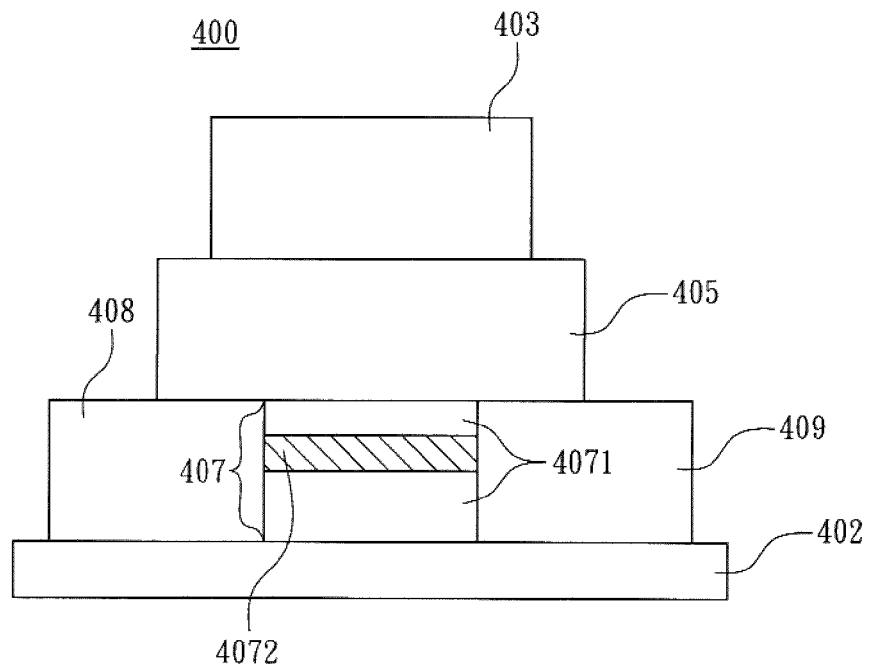
FIG. 4 is a cross-sectional diagram of an oxide semiconductor TFT according to a second embodiment of the present invention.

FIG. 4 is a cross-sectional diagram of an oxide semiconductor TFT according to a second embodiment of the present invention. In FIG. 4, an oxide semiconductor TFT 400 with a top gate structure comprises: a source electrode 408 and a drain electrode 409 formed on a substrate 402; a composite semiconductor active layer 407 formed between the source electrode 408 and the drain electrode 409; a gate dielectric layer 405 formed on the source electrode 408, the composite semiconductor active layer 407 and the drain electrode 409; and a gate electrode 403 formed on the gate dielectric layer 405 and corresponding to the composite semiconductor active layer 407. Accordingly, the oxide semiconductor TFT 400 in FIG. 4 is similar to the oxide semiconductor TFT 300 in FIG. 3 except that the composite semiconductor active layer 407 in FIG. 4 is different from the composite semiconductor active layer 307 in FIG. 3. Therefore, only the composite semiconductor active layer 407 will be described, while the descriptions of other components will not be presented.

In the present embodiment, the composite semiconductor active layer 407 may be formed by chemical vapor-phase deposition (CVD), spin coating, printing or sputtering to comprise at least a first oxide semiconductor layer 4071 and a second oxide semiconductor layer 4072. In the present embodiment, the second oxide semiconductor layer 4072 is inserted into the first oxide semiconductor layer 4071. The first oxide semiconductor layer 4071 is a low carrier-concentration semiconductor layer and may comprise ZnO, while the second oxide semiconductor layer 4072 is a high carrier-concentration semiconductor layer and may comprise InSnO (ITO), InZnO, GaZnO, AlZnO, InGaZnO or combination thereof.

Alternatively, the first oxide semiconductor layer 4071 is a low carrier-concentration semiconductor layer and may comprise InGaZnO, while the second oxide semiconductor layer 4072 is a high carrier-concentration semiconductor layer and may comprise InSnO (ITO), InZnO, GaZnO or combination thereof.

In the present embodiment, the carrier concentration of the first oxide semiconductor layer 4071 is lower than $10^{17}$ cm$^{-3}$. In the present embodiment, the carrier concentration of the second oxide semiconductor layer 4072 is higher than $10^{18}$ cm$^{-3}$.

In the present embodiment, the high carrier-concentration second oxide semiconductor layer 4072 is thinner (for example, than 10 nm) so as to lower the unstable current flowing through oxygen vacancies and enhance the stable current flowing through the heavy metal ionic bond structure. Moreover, by adjusting the thickness of the low carrier-concentration first oxide semiconductor layer 4071, the leakage current is kept low.

Figure 5:
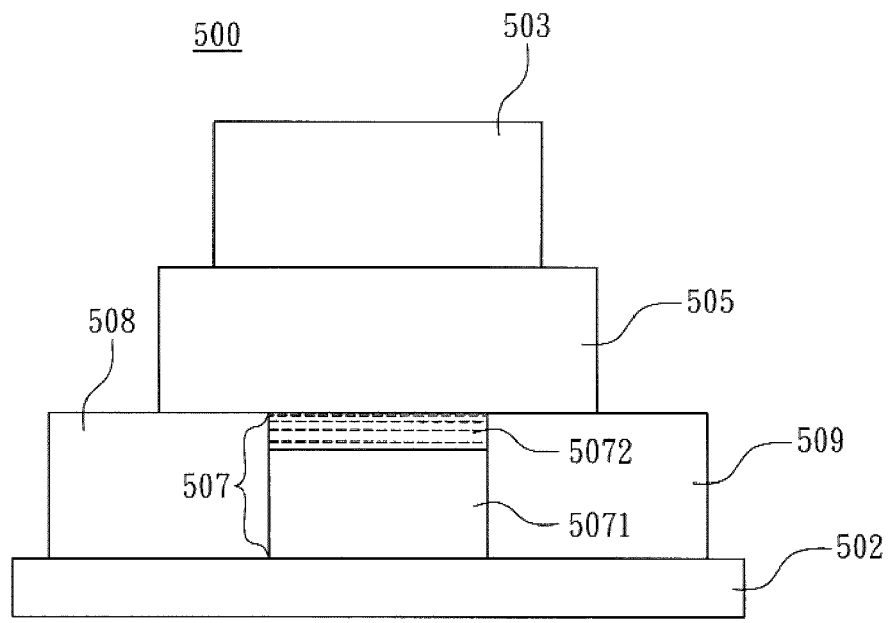
FIG. 5 is a cross-sectional diagram of an oxide semiconductor TFT according to a third embodiment of the present invention.

FIG. 5 is a cross-sectional diagram of an oxide semiconductor TFT according to a third embodiment of the present invention. In FIG. 5, an oxide semiconductor TFT 500 with a top gate structure comprises: a source electrode 508 and a drain electrode 509 formed on a substrate 502; a composite semiconductor active layer 507 formed between the source electrode 508 and the drain electrode 509; a gate dielectric layer 505 formed on the source electrode 508, the composite semiconductor active layer 507 and the drain electrode 509; and a gate electrode 503 formed on the gate dielectric layer 505 and corresponding to the composite semiconductor active layer 507. Accordingly, the oxide semiconductor TFT 500 in FIG. 5 is similar to the oxide semiconductor TFT 300 in FIG. 3 except that the composite semiconductor active layer 507 in FIG. 5 is different from the composite semiconductor active layer 307 in FIG. 3. Therefore, only the composite semiconductor active layer 507 will be described, while the descriptions of other components will not be presented.

In the present embodiment, the composite semiconductor active layer 507 may be formed by chemical vapor-phase deposition (CVD), spin coating, printing or sputtering to comprise at least a first oxide semiconductor layer 5071 and a second oxide semiconductor layer 5072. In the present embodiment, the second oxide semiconductor layer 5072 contacts the gate dielectric layer 505. The first oxide semiconductor layer 5071 is a low carrier-concentration semiconductor layer and may comprise ZnO, while the second oxide semiconductor layer 5072 is a high carrier-concentration graded semiconductor layer formed on a ZnO/graded semiconductor interface by gradually decreasing the mole fraction of ZnO from 1 and gradually increasing the mole fraction of InSnO (ITO), InZnO, GaZnO, AlZnO, InGaZnO or combination thereof from 0.

Alternatively, the first oxide semiconductor layer 5071 is a low carrier-concentration semiconductor layer and may comprise InGaZnO, while the second oxide semiconductor layer 5072 is a high carrier-concentration graded semiconductor layer formed on an InGaZnO/graded semiconductor interface by gradually decreasing the mole fraction of InGaZnO from 1 and gradually increasing the mole fraction of InSnO (ITO), InZnO, GaZnO or combination thereof from 0.

In the present embodiment, the carrier concentration of the first oxide semiconductor layer 5071 is lower than $10^{17}$ cm$^{-3}$. In the present embodiment, the carrier concentration of the second oxide semiconductor layer 5072 is higher than $10^{18}$ cm$^{-3}$.

In the present embodiment, the high carrier-concentration second oxide semiconductor layer 5072 is thinner (for example, than 10 nm) so as to lower the unstable current flowing through oxygen vacancies and enhance the stable current flowing through the heavy metal ionic bond structure. Moreover, by adjusting the thickness of the low carrier-concentration first oxide semiconductor layer 5071, the leakage current is kept low.

In the aforesaid first to third embodiments, three types of top gate oxide semiconductor TFT's 300-500 are disclosed. Even though the present invention is exemplified by the first to the third embodiments, anyone with ordinary skill in the art is capable of making modifications and equivalents still within the scope of the present invention. For example, the second oxide semiconductor layer 4072 in the second embodiment (FIG. 4) can be replaced by the high carrier-concentration graded semiconductor layer used in the second oxide semiconductor layer 5072 in the third embodiment (FIG. 5). More particularly, when ZnO is used as the first oxide semiconductor layer 4071, the graded semiconductor layer is formed on a bottom ZnO/graded semiconductor interface by gradually decreasing the mole fraction of ZnO from 1 and gradually increasing the mole fraction of InSnO (ITO), InZnO, GaZnO, AlZnO, InGaZnO or combination thereof from 0. Alternatively, when InGaZnO is used as the first oxide semiconductor layer 4071, the graded semiconductor layer is formed on a bottom InGaZnO/graded semiconductor interface by gradually decreasing the mole fraction of InGaZnO from 1 and gradually increasing the mole fraction of InSnO (ITO), InZnO, GaZnO or combination thereof from 0.

An oxide semiconductor TFT 600-800 with a bottom gate structure will also be disclosed in the fourth to the sixth embodiments.

Figure 6:
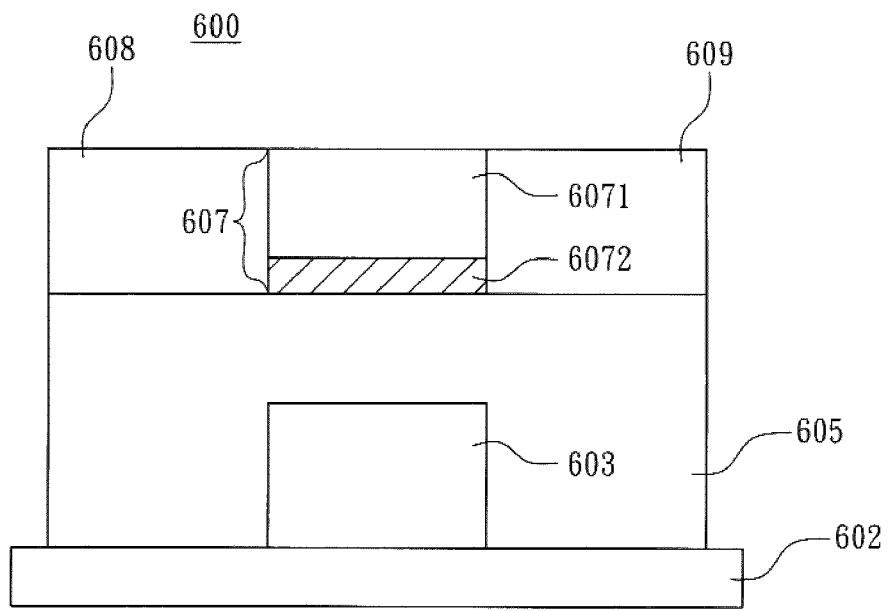
FIG. 6 is a cross-sectional diagram of an oxide semiconductor TFT according to a fourth embodiment of the present invention.

FIG. 6 is a cross-sectional diagram of an oxide semiconductor TFT according to a fourth embodiment of the present invention. In FIG. 6, an oxide semiconductor TFT 600 with a bottom gate structure comprises: a gate electrode 603 formed on a substrate 602; a gate dielectric layer 605 covering the gate electrode 603; a source electrode 608 and a drain electrode 609 formed on the gate dielectric layer 605; and a composite semiconductor active layer 607 formed between the source electrode 608 and the drain electrode 609 and corresponding to the gate electrode 603.

In the present embodiment, the composite semiconductor active layer 607 may be formed by chemical vapor-phase deposition (CVD), spin coating, printing or sputtering to comprise at least a first oxide semiconductor layer 6071 and a second oxide semiconductor layer 6072. In the present embodiment, the second oxide semiconductor layer 6072 contacts the gate dielectric layer 605. The first oxide semiconductor layer 6071 is a low carrier-concentration semiconductor layer and may comprise ZnO, while the second oxide semiconductor layer 6072 is a high carrier-concentration semiconductor layer and may comprise InSnO (ITO), InZnO, GaZnO, AlZnO, InGaZnO or combination thereof.

Alternatively, the first oxide semiconductor layer 6071 is a low carrier-concentration semiconductor layer and may comprise InGaZnO, while the second oxide semiconductor layer 6072 is a high carrier-concentration semiconductor layer and may comprise InSnO (ITO), InZnO, GaZnO or combination thereof.

In the present embodiment, the carrier concentration of the first oxide semiconductor layer 6071 is lower than $10^{17}$ cm$^{-3}$. In the present embodiment, the carrier concentration of the second oxide semiconductor layer 6072 is higher than $10^{18}$ cm$^{-3}$.

In the present embodiment, the high carrier-concentration second oxide semiconductor layer 6072 is thinner (for example, than 10 nm) so as to lower the unstable current flowing through oxygen vacancies and enhance the stable current flowing through the heavy metal ionic bond structure. Moreover, by adjusting the thickness of the low carrier-concentration first oxide semiconductor layer 6071, the leakage current is kept low.

Figure 7:
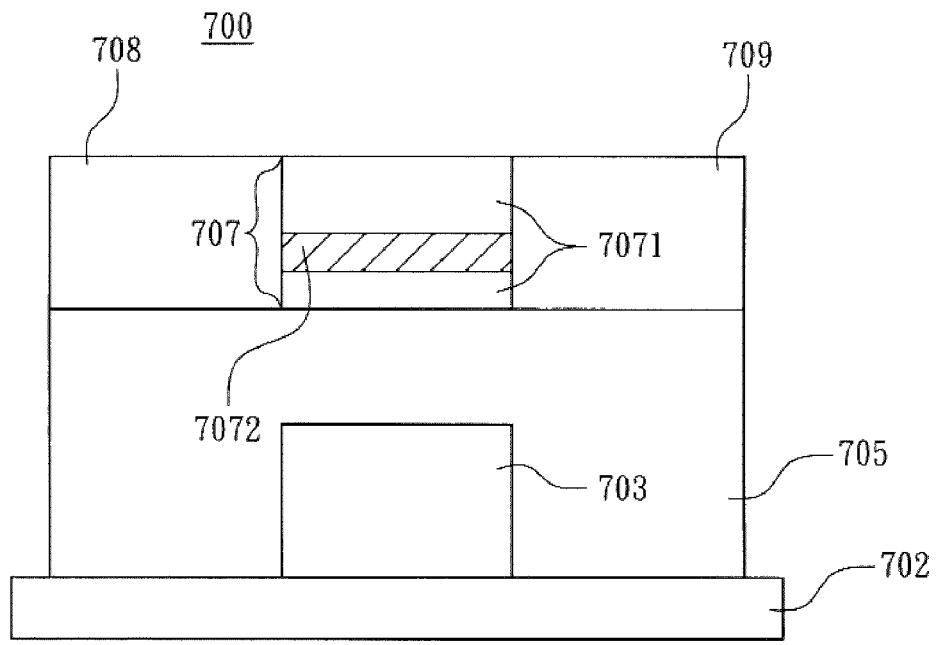
FIG. 7 is a cross-sectional diagram of an oxide semiconductor TFT according to a fifth embodiment of the present invention.

FIG. 7 is a cross-sectional diagram of an oxide semiconductor TFT according to a fifth embodiment of the present invention. In FIG. 7, an oxide semiconductor TFT 700 with a bottom gate structure comprises: a gate electrode 703 formed on a substrate 702; a gate dielectric layer 705 covering the gate electrode 703; a source electrode 708 and a drain electrode 709 formed on the gate dielectric layer 705; and a composite semiconductor active layer 707 formed between the source electrode 708 and the drain electrode 709 and corresponding to the gate electrode 703. Accordingly, the oxide semiconductor TFT 700 in FIG. 7 is similar to the oxide semiconductor TFT 600 in FIG. 6 except that the composite semiconductor active layer 707 in FIG. 7 is different from the composite semiconductor active layer 607 in FIG. 6. Therefore, only the composite semiconductor active layer 707 will be described, while the descriptions of other components will not be presented.

In the present embodiment, the composite semiconductor active layer 707 may be formed by chemical vapor-phase deposition (CVD), spin coating, printing or sputtering to comprise at least a first oxide semiconductor layer 7071 and a second oxide semiconductor layer 7072. In the present embodiment, the second oxide semiconductor layer 7072 is inserted into the first oxide semiconductor layer 7071. The first oxide semiconductor layer 7071 is a low carrier-concentration semiconductor layer and may comprise ZnO, while the second oxide semiconductor layer 7072 is a high carrier-concentration semiconductor layer and may comprise InSnO (ITO), InZnO, GaZnO, AlZnO, InGaZnO or combination thereof.

Alternatively, the first oxide semiconductor layer 7071 is a low carrier-concentration semiconductor layer and may comprise InGaZnO, while the second oxide semiconductor layer 7072 is a high carrier-concentration semiconductor layer and may comprise InSnO (ITO), InZnO, GaZnO or combination thereof.

In the present embodiment, the carrier concentration of the first oxide semiconductor layer 7071 is lower than $10^{17}$ cm$^{-3}$. In the present embodiment, the carrier concentration of the second oxide semiconductor layer 7072 is higher than $10^{18}$ cm$^{-3}$.

In the present embodiment, the high carrier-concentration second oxide semiconductor layer 7072 is thinner (for example, than 10 nm) so as to lower the unstable current flowing through oxygen vacancies and enhance the stable current flowing through the heavy metal ionic bond structure. Moreover, by adjusting the thickness of the low carrier-concentration first oxide semiconductor layer 7071, the leakage current is kept low.

Figure 8:
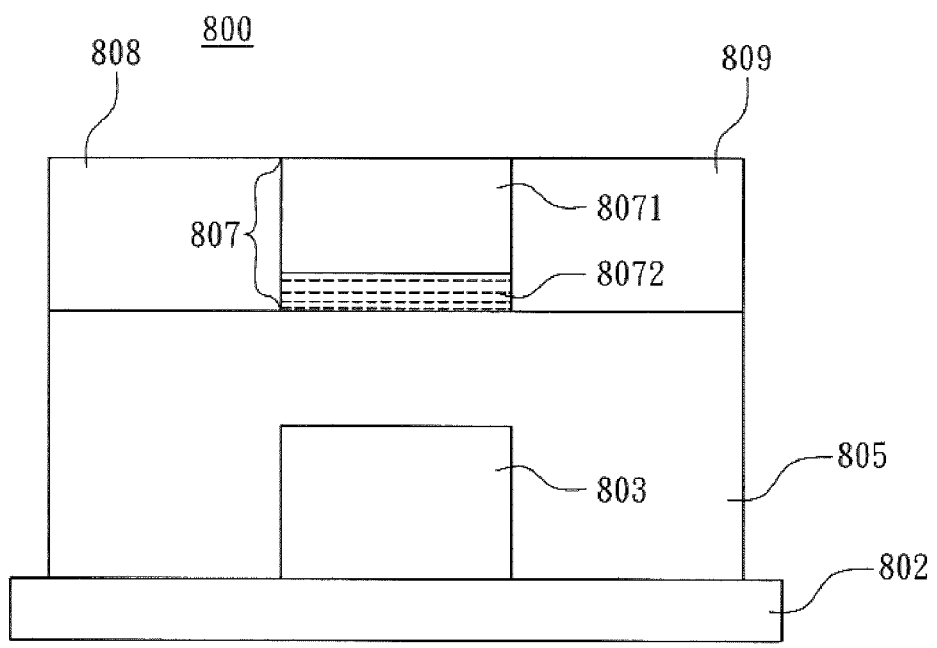
FIG. 8 is a cross-sectional diagram of an oxide semiconductor TFT according to a sixth embodiment of the present invention.

FIG. 8 is a cross-sectional diagram of an oxide semiconductor TFT according to a sixth embodiment of the present invention. In FIG. 8, an oxide semiconductor TFT 800 with a bottom gate structure comprises: a gate electrode 803 formed on a substrate 802; a gate dielectric layer 805 covering the gate electrode 803; a source electrode 808 and a drain electrode 809 formed on the gate dielectric layer 805; and a composite semiconductor active layer 807 formed between the source electrode 808 and the drain electrode 809 and corresponding to the gate electrode 803. Accordingly, the oxide semiconductor TFT 800 in FIG. 8 is similar to the oxide semiconductor TFT 600 in FIG. 6 except that the composite semiconductor active layer 807 in FIG. 8 is different from the composite semiconductor active layer 607 in FIG. 6. Therefore, only the composite semiconductor active layer 807 will be described, while the descriptions of other components will not be presented.

In the present embodiment, the composite semiconductor active layer 807 may be formed by chemical vapor-phase deposition (CVD), spin coating, printing or sputtering to comprise at least a first oxide semiconductor layer 8071 and a second oxide semiconductor layer 8072. In the present embodiment, the second oxide semiconductor layer 8072 contacts the gate dielectric layer 805. The first oxide semiconductor layer 8071 is a low carrier-concentration semiconductor layer and may comprise ZnO, while the second oxide semiconductor layer 8072 is a high carrier-concentration graded semiconductor layer formed on a gate dielectric/graded semiconductor interface by gradually increasing the mole fraction of ZnO from 0 and gradually decreasing the mole fraction of InSnO (ITO), InZnO, GaZnO, AlZnO, InGaZnO or combination thereof from 1.

Alternatively, the first oxide semiconductor layer 8071 is a low carrier-concentration semiconductor layer and may comprise InGaZnO, while the second oxide semiconductor layer 8072 is a high carrier-concentration graded semiconductor layer formed on a gate dielectric/graded semiconductor interface by gradually increasing the mole fraction of InGaZnO from 0 and gradually decreasing the mole fraction of InSnO (ITO), InZnO, GaZnO or combination thereof from 1.

In the present embodiment, the carrier concentration of the first oxide semiconductor layer 8071 is lower than $10^{17}$ cm$^{-3}$. In the present embodiment, the carrier concentration of the second oxide semiconductor layer 8072 is higher than $10^{18}$ cm$^{-3}$.

In the present embodiment, the high carrier-concentration second oxide semiconductor layer 8072 is thinner (for example, than 10 nm) so as to lower the unstable current flowing through oxygen vacancies and enhance the stable current flowing through the heavy metal ionic bond structure. Moreover, by adjusting the thickness of the low carrier-concentration first oxide semiconductor layer 8071, the leakage current is kept low.

In the aforesaid fourth to sixth embodiments, three types of bottom gate oxide semiconductor TFT's 600-800 are disclosed. Even though the present invention is exemplified by the fourth to the sixth embodiments, anyone with ordinary skill in the art is capable of making modifications and equivalents still within the scope of the present invention. For example, the second oxide semiconductor layer 7072 in the fifth embodiment (FIG. 7) can be replaced by the high carrier-concentration graded semiconductor layer used in the second oxide semiconductor layer 8072 in the sixth embodiment (FIG. 8). More particularly, when ZnO is used as the first oxide semiconductor layer 7071, the graded semiconductor layer is formed on a bottom ZnO/graded semiconductor interface by gradually increasing the mole fraction of ZnO from 0 and gradually decreasing the mole fraction of InSnO (ITO), InZnO, GaZnO, AlZnO, InGaZnO or combination thereof from 1. Alternatively, when InGaZnO is used as the first oxide semiconductor layer 7071, the graded semiconductor layer is formed on a bottom InGaZnO/graded semiconductor interface by gradually increasing the mole fraction of InGaZnO from 0 and gradually decreasing the mole fraction of InSnO (ITO), InZnO, GaZnO or combination thereof from 1.

Figure 9A:
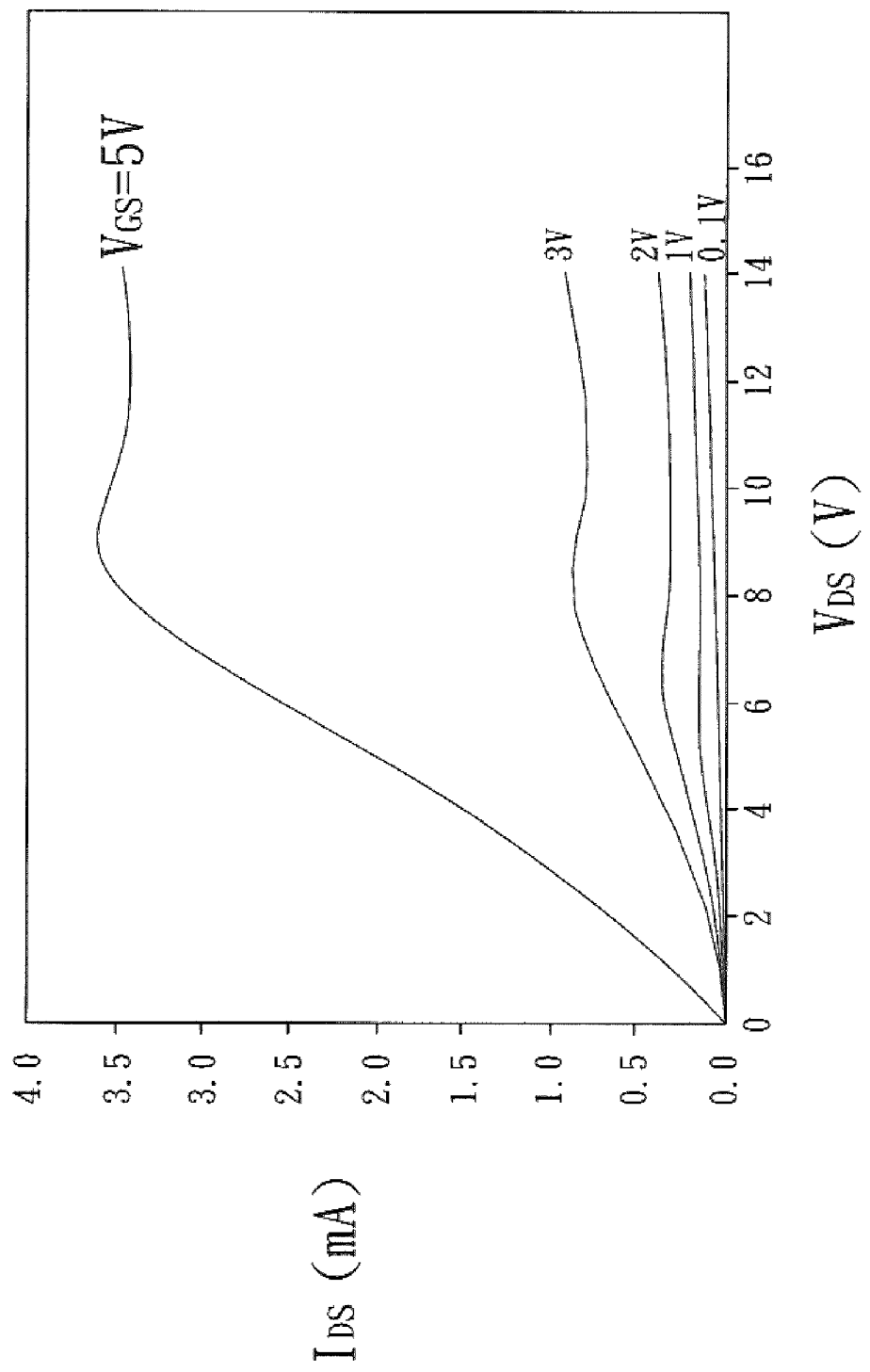
FIG. 9A and FIG. 9B show respectively the current-voltage characteristics of the oxide semiconductor TFT of the present invention and the conventional oxide semiconductor TFT.
Figure 9B:
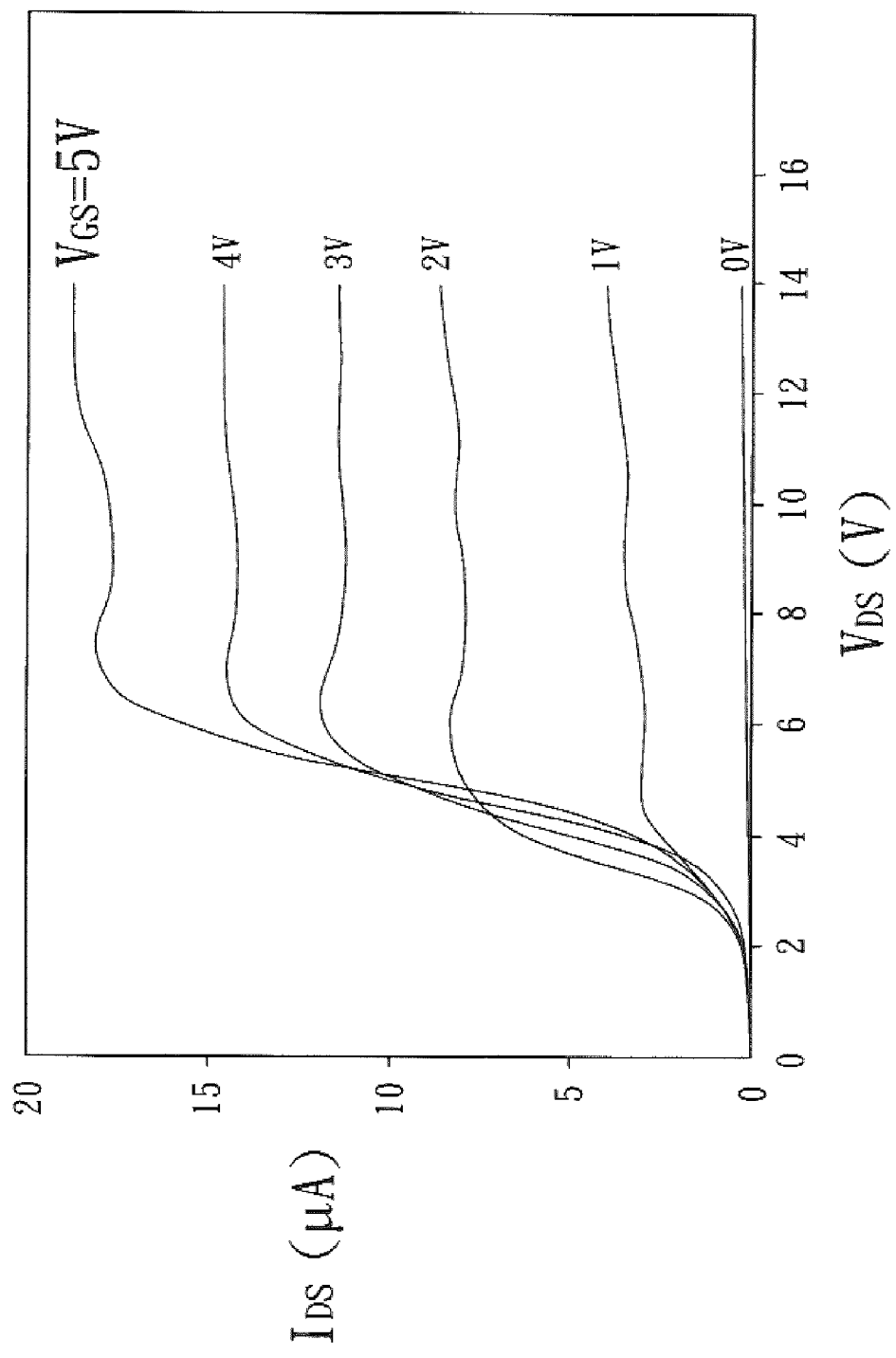

FIG. 9A and FIG. 9B show respectively the current-voltage characteristics of the oxide semiconductor TFT of the present invention and the conventional oxide semiconductor TFT. It is observed that the oxide semiconductor TFT according to the aforesaid embodiments of the present invention provides an operation current in the milli-ampere (mA) range, as shown in FIG. 9A, while the conventional ZnO-based oxide semiconductor TFT only provides an operation current in the micro-ampere (μA) range, as shown in FIG. 9B.

Accordingly, the present invention discloses an oxide semiconductor TFT comprising a composite semiconductor active layer to improve the current characteristics of the oxide semiconductor TFT, enhance the stable driving current and lower the unstable current due to oxygen vacancies. Moreover, by adjusting the thickness of the semiconductor active layer, the leakage current is kept low. Therefore, the present invention is useful, novel and non-obvious.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An oxide semiconductor TFT, comprising:
   a source electrode and a drain electrode formed on a substrate;
   a composite semiconductor active layer formed between the source electrode and the drain electrode;
   a gate dielectric layer formed on the source electrode, the composite semiconductor active layer and the drain electrode; and
   a gate electrode formed on the gate dielectric layer and corresponding to the composite semiconductor active layer;
   wherein the composite semiconductor active layer comprises at least a low carrier-concentration first oxide semiconductor layer and a high carrier-concentration second oxide semiconductor layer.

2. The oxide semiconductor TFT as recited in claim 1, wherein the carrier concentration of the first oxide semiconductor layer is lower than $10^{17}$ cm$^{-3}$, and the carrier concentration of the second oxide semiconductor layer is higher than $10^{18}$ cm$^{-3}$.

3. The oxide semiconductor TFT as recited in claim 1, wherein the thickness of the second oxide semiconductor layer is smaller than the thickness of the first oxide semiconductor layer.

4. The oxide semiconductor TFT as recited in claim 1, wherein the second oxide semiconductor and the second oxide semiconductor layer are respectively formed by chemical vapor-phase deposition (CVD), spin coating, printing or sputtering.

5. The oxide semiconductor TFT as recited in claim 1, wherein the second oxide semiconductor layer contacts the gate dielectric layer.

6. The oxide semiconductor TFT as recited in claim 5, wherein the first oxide semiconductor layer comprises ZnO, and the second oxide semiconductor layer comprises InSnO (ITO), InZnO, GaZnO, AlZnO, InGaZnO or combination thereof.

7. The oxide semiconductor TFT as recited in claim 5, wherein the first oxide semiconductor layer comprises InGaZnO, and the second oxide semiconductor layer comprises InSnO (ITO), InZnO, GaZnO or combination thereof.

8. The oxide semiconductor TFT as recited in claim 5, wherein the first oxide semiconductor layer comprises ZnO, and the second oxide semiconductor layer is a graded semiconductor layer formed on a ZnO/graded semiconductor interface by gradually decreasing the mole fraction of ZnO from 1 and gradually increasing the mole fraction of InSnO (ITO), InZnO, GaZnO, AlZnO, InGaZnO or combination thereof from 0.

9. The oxide semiconductor TFT as recited in claim 5, wherein the first oxide semiconductor layer comprises InGaZnO, and the second oxide semiconductor layer is a graded semiconductor layer formed on an InGaZnO/graded semiconductor interface by gradually decreasing the mole fraction of InGaZnO from 1 and gradually increasing the mole fraction of InSnO (ITO), InZnO, GaZnO or combination thereof from 0.

10. The oxide semiconductor TFT as recited in claim 1, wherein the second oxide semiconductor layer is inserted into the first oxide semiconductor layer.

11. The oxide semiconductor TFT as recited in claim 10, wherein the first oxide semiconductor layer comprises ZnO, and the second oxide semiconductor layer comprises InSnO (ITO), InZnO, GaZnO, AlZnO, InGaZnO or combination thereof.

12. The oxide semiconductor TFT as recited in claim 10, wherein the first oxide semiconductor layer comprises InGaZnO, and the second oxide semiconductor layer comprises InSnO (ITO), InZnO, GaZnO or combination thereof.

13. The oxide semiconductor TFT as recited in claim 10, wherein the first oxide semiconductor layer comprises ZnO, and the second oxide semiconductor layer is a graded semiconductor layer formed on a bottom ZnO/graded semiconductor interface by gradually decreasing the mole fraction of ZnO from 1 and gradually increasing the mole fraction of InSnO (ITO), InZnO, GaZnO, AlZnO, InGaZnO or combination thereof from 0.

14. The oxide semiconductor TFT as recited in claim 10, wherein the first oxide semiconductor layer comprises InGaZnO, and the second oxide semiconductor layer is a graded semiconductor layer formed on a bottom InGaZnO/graded semiconductor interface by gradually decreasing the mole fraction of InGaZnO from 1 and gradually increasing the mole fraction of InSnO (ITO), InZnO, GaZnO or combination thereof from 0.

15. An oxide semiconductor TFT, comprising:
a gate electrode formed on a substrate;
a gate dielectric layer covering the gate electrode;
a source electrode and a drain electrode formed on the gate dielectric layer; and
a composite semiconductor active layer formed between the source electrode and the drain electrode and corresponding to the gate electrode;
wherein the composite semiconductor active layer comprises at least a low carrier-concentration first oxide semiconductor layer and a high carrier-concentration second oxide semiconductor layer.

16. The oxide semiconductor TFT as recited in claim 15, wherein the carrier concentration of the first oxide semiconductor layer is lower than $10^{17}$ cm$^{-3}$, and the carrier concentration of the second oxide semiconductor layer is higher than $10^{18}$ cm$^{-3}$.

17. The oxide semiconductor TFT as recited in claim 15, wherein the thickness of the second oxide semiconductor layer is smaller than the thickness of the first oxide semiconductor layer.

18. The oxide semiconductor TFT as recited in claim 15, wherein the second oxide semiconductor and the second oxide semiconductor layer are respectively formed by chemical vapor-phase deposition (CVD), spin coating, printing or sputtering.

19. The oxide semiconductor TFT as recited in claim 15, wherein the second oxide semiconductor layer contacts the gate dielectric layer.

20. The oxide semiconductor TFT as recited in claim 19, wherein the first oxide semiconductor layer comprises ZnO, and the second oxide semiconductor layer comprises InSnO (ITO), InZnO, GaZnO, AlZnO, InGaZnO or combination thereof.

21. The oxide semiconductor TFT as recited in claim 19, wherein the first oxide semiconductor layer comprises InGaZnO, and the second oxide semiconductor layer comprises InSnO (ITO), InZnO, GaZnO or combination thereof.

22. The oxide semiconductor TFT as recited in claim 19, wherein the first oxide semiconductor layer comprises ZnO, and the second oxide semiconductor layer is a graded semiconductor layer formed on a gate dielectric/graded semiconductor interface by gradually increasing the mole fraction of ZnO from 0 and gradually decreasing the mole fraction of InSnO (ITO), InZnO, GaZnO, AlZnO, InGaZnO or combination thereof from 1.

23. The oxide semiconductor TFT as recited in claim 19, wherein the first oxide semiconductor layer comprises InGaZnO, and the second oxide semiconductor layer is a graded semiconductor layer formed on a gate dielectric/graded semiconductor interface by gradually increasing the mole fraction of InGaZnO from 0 and gradually decreasing the mole fraction of InSnO (ITO), InZnO, GaZnO or combination thereof from 1.

24. The oxide semiconductor TFT as recited in claim 15, wherein the second oxide semiconductor layer is inserted into the first oxide semiconductor layer.

25. The oxide semiconductor TFT as recited in claim 24, wherein the first oxide semiconductor layer comprises ZnO, and the second oxide semiconductor layer comprises InSnO (ITO), InZnO, GaZnO, AlZnO, InGaZnO or combination thereof.

26. The oxide semiconductor TFT as recited in claim 24, wherein the first oxide semiconductor layer comprises InGaZnO, and the second oxide semiconductor layer comprises InSnO (ITO), InZnO, GaZnO or combination thereof.

27. The oxide semiconductor TFT as recited in claim 24, wherein the first oxide semiconductor layer comprises ZnO, and the second oxide semiconductor layer is a graded semiconductor layer formed on a bottom ZnO/graded semiconductor interface by gradually increasing the mole fraction of ZnO from 0 and gradually decreasing the mole fraction of InSnO (ITO), InZnO, GaZnO, AlZnO, InGaZnO or combination thereof from 1.

28. The oxide semiconductor TFT as recited in claim 24, wherein the first oxide semiconductor layer comprises InGaZnO, and the second oxide semiconductor layer is a graded semiconductor layer formed on a bottom InGaZnO/graded semiconductor interface by gradually increasing the mole fraction of InGaZnO from 0 and gradually decreasing the mole fraction of InSnO (ITO), InZnO, GaZnO or combination thereof from 1.

* * * * *